(12) United States Patent
Shin et al.

(10) Patent No.: US 12,520,710 B2
(45) Date of Patent: Jan. 6, 2026

(54) FLEXIBLE DISPLAY APPARATUS AND MANUFACTURING METHOD THEREOF

(71) Applicant: Samsung Display Co., Ltd., Yongin-si (KR)

(72) Inventors: Heekyun Shin, Incheon (KR); Byunghoon Kang, Hwaseong-si (KR); Youngjun Kim, Hwaseong-si (KR); Sumin An, Cheonan-si (KR); Woojin Cho, Yongin-si (KR); Seungjun Moon, Cheonan-si (KR); Jeongmin Park, Seoul (KR); Dongkyun Seo, Seoul (KR); Junho Sim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 428 days.

(21) Appl. No.: 17/694,494

(22) Filed: Mar. 14, 2022

(65) Prior Publication Data

US 2022/0223807 A1    Jul. 14, 2022

Related U.S. Application Data

(62) Division of application No. 16/578,408, filed on Sep. 23, 2019, now Pat. No. 11,276,831.

(30) Foreign Application Priority Data

Nov. 9, 2018 (KR) .................. 10-2018-0137566

(51) Int. Cl.
*H10K 71/80* (2023.01)
*B32B 7/14* (2006.01)
(Continued)

(52) U.S. Cl.
CPC ............ *H10K 71/80* (2023.02); *B32B 7/14* (2013.01); *B32B 37/1292* (2013.01);
(Continued)

(58) Field of Classification Search
None
See application file for complete search history.

(56) References Cited

U.S. PATENT DOCUMENTS 7,279,401 B2   10/2007   Wong et al.
9,871,228 B2    1/2018   Lee et al.
(Continued)

FOREIGN PATENT DOCUMENTS

EP          2927982       10/2015
KR   10-2015-0009289       1/2015
(Continued)

OTHER PUBLICATIONS

Extended European Search Report dated Apr. 6, 2020, in European Patent Application No. 19206470.7.
(Continued)

*Primary Examiner* — Erik T. K. Peterson
(74) *Attorney, Agent, or Firm* — CANTOR COLBURN LLP

(57) ABSTRACT

A method of manufacturing a flexible display apparatus includes: preparing a substrate; forming a first charge adhesive layer having a first charge on the substrate; forming a second charge adhesive layer having a second charge, which is opposite to the first charge, on the first charge adhesive layer; forming a first charge adhesive pattern and a second charge adhesive pattern by removing an edge of each of the first charge adhesive layer and the second charge adhesive layer; forming a flexible substrate on the substrate on which the first charge adhesive pattern and the second charge adhesive pattern are formed; forming a display unit on the flexible substrate; cutting the substrate, the first charge adhesive pattern, the second charge adhesive pattern, the flexible substrate, and the display unit along a cutting line; and separating the substrate and the flexible substrate.

2 Claims, 9 Drawing Sheets

(51) Int. Cl.
   *B32B 37/12* (2006.01)
   *B32B 37/24* (2006.01)
   *B32B 38/00* (2006.01)
   *C09J 9/02* (2006.01)
   *C09J 179/02* (2006.01)
   *H10K 59/80* (2023.01)
   *H10K 77/10* (2023.01)

(52) U.S. Cl.
   CPC .......... *B32B 37/24* (2013.01); *B32B 38/0004* (2013.01); *B32B 38/0008* (2013.01); *C09J 9/02* (2013.01); *C09J 179/02* (2013.01); *H10K 77/111* (2023.02); *B32B 2037/243* (2013.01); *B32B 2255/20* (2013.01); *B32B 2255/26* (2013.01); *B32B 2255/28* (2013.01); *B32B 2307/412* (2013.01); *B32B 2307/546* (2013.01); *B32B 2310/14* (2013.01); *B32B 2457/206* (2013.01); *H10K 59/873* (2023.02)

(56) References Cited

U.S. PATENT DOCUMENTS

| | | |
|---|---|---|
| 10,211,239 B2 | 2/2019 | Yamazaki et al. |
| 10,236,408 B2 | 3/2019 | Yamazaki et al. |
| 10,629,831 B2 | 4/2020 | Ohno et al. |
| 10,861,733 B2 | 12/2020 | Ohno et al. |
| 2010/0068483 A1 | 3/2010 | Leu et al. |
| 2010/0143708 A1 | 6/2010 | Liao et al. |
| 2010/0167031 A1 | 7/2010 | Leu et al. |
| 2010/0203296 A1 | 8/2010 | Tsai et al. |
| 2010/0267203 A1 | 10/2010 | Chen et al. |
| 2011/0139747 A1 | 6/2011 | Lee |
| 2011/0291544 A1 | 12/2011 | Wei et al. |
| 2012/0228617 A1 | 9/2012 | Ko et al. |
| 2013/0071650 A1 | 3/2013 | Liu et al. |
| 2014/0065916 A1 | 3/2014 | Lee et al. |
| 2014/0124132 A1 | 5/2014 | Kim |
| 2014/0256206 A1 | 9/2014 | Kim |
| 2014/0312314 A1 | 10/2014 | Khachatryan |
| 2014/0327006 A1 | 11/2014 | Ke |
| 2015/0021631 A1 | 1/2015 | Huh et al. |
| 2015/0060869 A1 | 3/2015 | Ro et al. |
| 2015/0060870 A1 | 3/2015 | Ro et al. |
| 2015/0072454 A1 | 3/2015 | Kim et al. |
| 2015/0099088 A1 | 4/2015 | Lin et al. |
| 2015/0188080 A1 | 7/2015 | Choi et al. |
| 2015/0195915 A1 | 7/2015 | Namkung |
| 2015/0236280 A1 | 8/2015 | Sakuishi et al. |
| 2016/0141552 A1 | 5/2016 | Chen |
| 2016/0204364 A1 | 7/2016 | Joo et al. |
| 2016/0347047 A1 | 12/2016 | Eguchi et al. |
| 2017/0047558 A1* | 2/2017 | Lee ...................... H10K 50/814 |
| 2017/0110538 A1* | 4/2017 | Nirmalraj ........... H01L 29/2003 |
| 2017/0210115 A1 | 7/2017 | Ohno et al. |
| 2017/0345850 A1 | 11/2017 | Lee et al. |
| 2018/0142109 A1* | 5/2018 | Kuljanishvili .......... C23C 14/22 |
| 2018/0184519 A1 | 6/2018 | Jia et al. |
| 2019/0036024 A1 | 1/2019 | Bai |
| 2019/0123068 A1 | 4/2019 | Lee et al. |
| 2019/0140216 A1 | 5/2019 | Shin et al. |
| 2019/0157587 A1 | 5/2019 | Jia et al. |
| 2019/0237688 A1 | 8/2019 | Shin et al. |
| 2020/0020869 A1 | 1/2020 | Kang et al. |
| 2020/0047369 A1 | 2/2020 | Sim et al. |
| 2020/0111998 A1 | 4/2020 | Ko et al. |
| 2020/0321563 A1 | 10/2020 | Moon et al. |

FOREIGN PATENT DOCUMENTS

| | | |
|---|---|---|
| KR | 10-2015-0029045 | 3/2015 |
| KR | 10-1530378 | 6/2015 |

OTHER PUBLICATIONS

Non-Final Office Action dated Mar. 18, 2021, in U.S. Appl. No. 16/578,408.

Final Office Action dated Sep. 20, 2021, in U.S. Appl. No. 16/578,408.

Notice of Allowance dated Nov. 16, 2021, in U.S. Appl. No. 16/578,408.

* cited by examiner

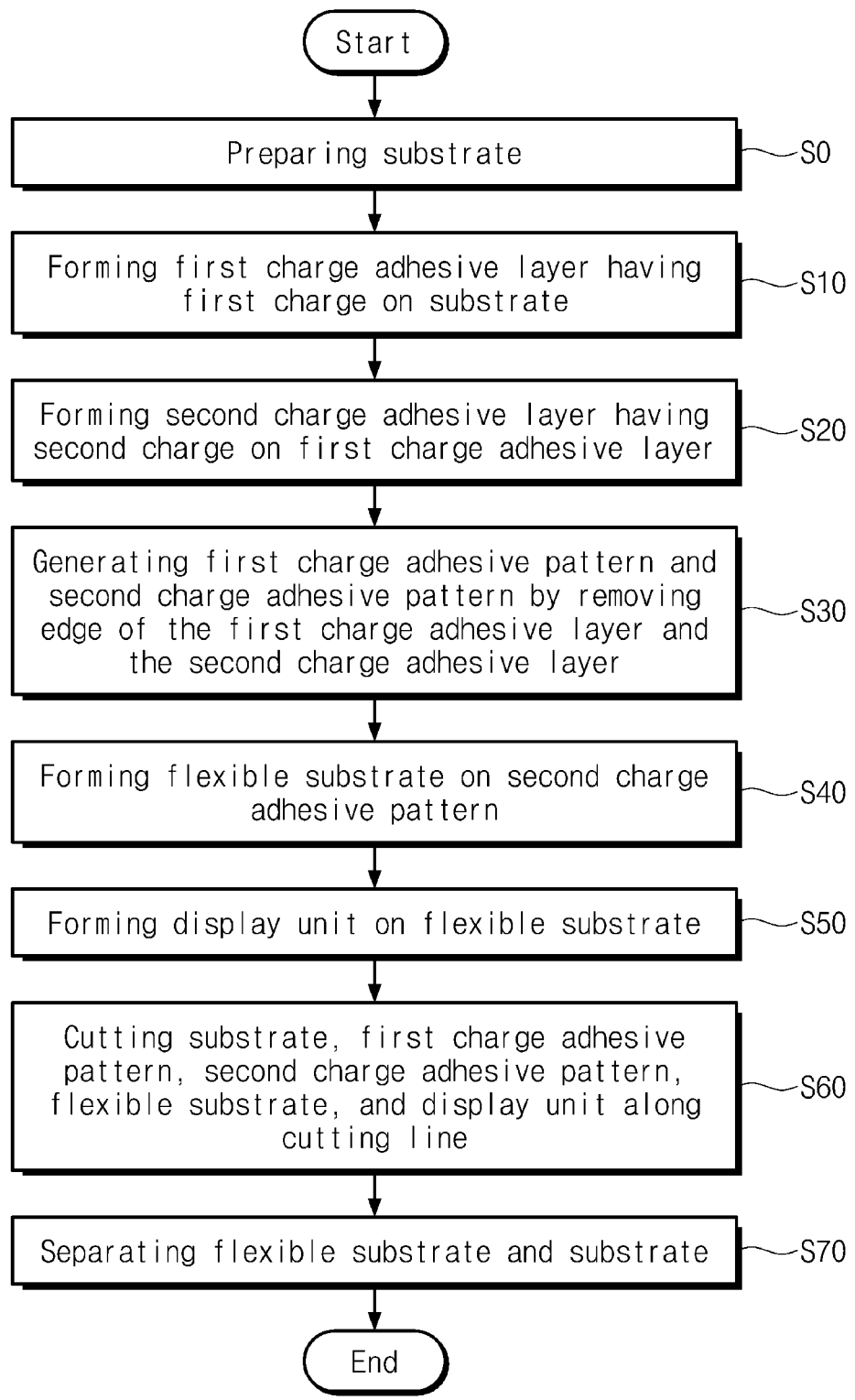

FLEXIBLE DISPLAY APPARATUS AND MANUFACTURING METHOD THEREOF

CROSS-REFERENCE TO RELATED APPLICATIONS

This application is a Division of U.S. patent application Ser. No. 16/578,408, filed Sep. 23, 2019, which claims priority to and the benefit of Korean Patent Application No. 10-2018-0137566, filed Nov. 9, 2018, each of which is hereby incorporated by reference for all purposes as if fully set forth herein.

BACKGROUND

Field

Exemplary embodiments/implementations of the invention relate generally to a flexible display apparatus and a manufacturing method thereof, and more specifically, to a transparent flexible display apparatus and a manufacturing method thereof.

Discussion of the Background

A display apparatus is an apparatus for displaying an image. In recent years, an organic light-emitting display apparatus has been spotlighted. The organic light-emitting display apparatus has such features as low power consumption, high luminance, and high responding speed.

The organic light emitting apparatus may have a flexible property by adopting a flexible organic light emitting display panel and a transparent property by adopting a transparent organic light emitting display panel. In order to manufacture the organic light emitting display panel, a method of bonding a flexible substrate on a substrate, then performing a following process, and separating the flexible substrate from the substrate is introduced.

However, in a process of using laser to separate the flexible substrate from the substrate, they may not separated uniformly from each other, or the flexible display apparatus is thermally deteriorated to degrade its transmittance.

The above information disclosed in this Background section is only for understanding of the background of the inventive concepts, and, therefore, it may contain information that does not constitute prior art.

SUMMARY

The present disclosure provides a transparent flexible display apparatus that has a high transmittance by easily separating a substrate and a flexible substrate without being irradiated with laser.

The present disclosure also provides a method of manufacturing a transparent flexible display apparatus in which a substrate and a flexible substrate is not easily separated in a process of forming a display unit due to direct contact between the substrate and the flexible substrate.

Additional features of the inventive concepts will be set forth in the description which follows, and in part will be apparent from the description, or may be learned by practice of the inventive concepts.

An embodiment of the inventive concept provides a method of manufacturing a flexible display apparatus, the method including: preparing a substrate; forming a first charge adhesive layer having a first charge on the substrate; forming a second charge adhesive layer having a second charge, which is opposite to the first charge, on the first charge adhesive layer; forming a first charge adhesive pattern and a second charge adhesive pattern by removing an edge of each of the first charge adhesive layer and the second charge adhesive layer; forming a flexible substrate on the substrate on which the first charge adhesive pattern and the second charge adhesive pattern are formed; forming a display unit on the flexible substrate; cutting the substrate, the first charge adhesive pattern, the second charge adhesive pattern, the flexible substrate, and the display unit along a cutting line; and separating the substrate and the flexible substrate.

In an embodiment, the first charge adhesive layer may include graphene oxide.

In an embodiment, the second charge adhesive layer may include montmorillonite, molybdenum disulfide, or hexagonal boron nitride (hBN).

In an embodiment, the forming of the first charge adhesive pattern and the second charge adhesive pattern may remove a portion of each of the first charge adhesive layer and the second charge adhesive layer by spraying a gas in a plasma state in which nitrogen and air are mixed.

In an embodiment, a portion of a top surface of the substrate may be exposed by the forming of the first charge adhesive pattern and the second charge adhesive pattern.

In an embodiment, the flexible substrate may contact the portion of the substrate, which is exposed by the first charge adhesive pattern and the second charge adhesive pattern, by the forming of the flexible substrate.

In an embodiment, the forming of the flexible substrate may form the flexible substrate by applying a polymer material on an area greater than that occupied by the first charge adhesive pattern and the second charge adhesive pattern.

In an embodiment, the cutting line may be defined to overlap the first charge adhesive pattern and the second charge adhesive pattern on a plane.

In an embodiment, the cutting line may have a closed loop shape on a plane, and be defined along an edge of each of the first charge adhesive pattern and the second charge adhesive pattern.

In an embodiment, the second charge adhesive layer may be remained on the flexible substrate by the separating of the substrate and the flexible substrate.

In an embodiment of the inventive concept, a method of manufacturing a flexible display apparatus includes: preparing a substrate; forming a lower first charge adhesive layer having a first charge on the substrate; forming a lower second charge adhesive layer having a second charge, which is opposite to the first charge, on the lower first charge adhesive layer; forming an upper first charge adhesive layer having the first charge on the lower second charge adhesive substrate; forming an upper second charge adhesive layer having the second charge on the upper first charge adhesive layer; forming a lower first charge adhesive pattern, a lower second charge adhesive pattern, an upper first charge adhesive pattern, and an upper second charge adhesive pattern by removing an edge of each of the lower first charge adhesive layer, the lower second charge adhesive layer, the upper first charge adhesive layer, and the upper second charge adhesive layer; forming a flexible substrate on the substrate on which the lower first charge adhesive pattern, the lower second charge adhesive pattern, the upper first charge adhesive pattern, and the upper second charge adhesive pattern; forming a display unit on the flexible substrate; cutting the substrate, the lower first charge adhesive pattern, the upper second charge adhesive pattern, the upper first charge adhesive pattern, the upper second charge adhesive pattern, the flexible substrate, and the display unit along a cutting line; and separating the substrate and the flexible substrate.

In an embodiment, the lower first charge adhesive layer may include graphene oxide, and the upper first charge adhesive layer may include polyethyleneimine (PEI).

In an embodiment, each of the lower second charge adhesive layer and the upper second charge adhesive layer may include montmorillonite, molybdenum disulfide, or hexagonal boron nitride (hBN).

In an embodiment, the upper first charge adhesive pattern and the upper second charge adhesive pattern may be remained on the flexible substrate by the separating of the substrate and the flexible substrate.

In an embodiment, the lower second charge adhesive pattern, the upper first charge adhesive pattern, and the upper second charge adhesive pattern may be remained on the flexible substrate by the separating of the substrate and the flexible substrate.

In an embodiment of the inventive concept, a flexible display apparatus includes: a flexible substrate; a circuit element layer disposed on the flexible substrate; a display element layer disposed on the circuit element layer and including an organic light emitting diode; an encapsulation layer disposed on the display element layer to seal the display element layer; and a charge adhesive layer that contacts a lower portion of the flexible substrate, has a charge, and includes montmorillonite, molybdenum disulfide, or hexagonal boron nitride (hBN).

In an embodiment, the charge adhesive layer may have a bottom surface having an concave-convex shape.

In an embodiment, the concave-convex of the bottom surface of the charge adhesive layer may be randomly distributed.

In an embodiment, the concave-convex of the bottom surface of the charge adhesive layer may have a height of about 1 nm or less.

In an embodiment, the flexible display apparatus may further include a lower charge adhesive layer that contacts a lower portion of the charge adhesive layer, and the lower charge adhesive layer may include polyethyleneimine (PEI).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 1 is a flowchart representing a method of manufacturing a flexible display apparatus according to an embodiment of the inventive concept;

DETAILED DESCRIPTION

Figure 2A:
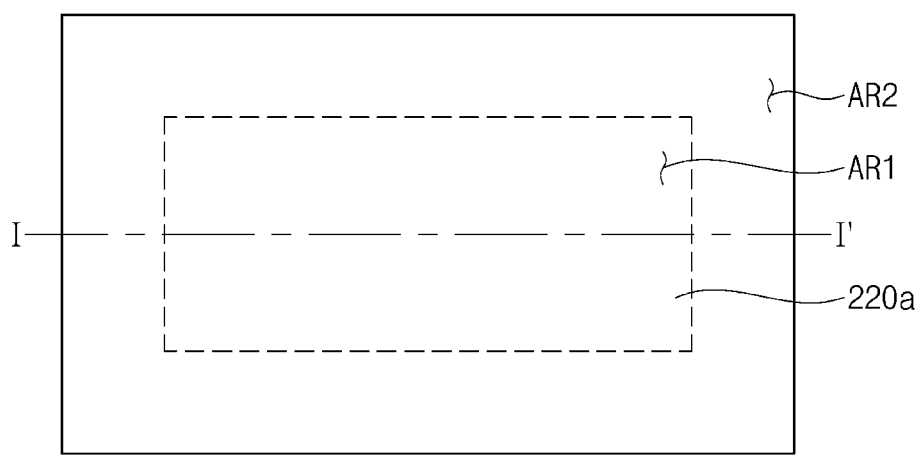
FIGS. 2A, 3A, 4A, and 5A are plan views illustrating a manufacturing process of forming a flexible display apparatus according to an embodiment of the inventive concept.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display apparatus according to an embodiment of the inventive concept will be described with reference to the accompanying drawings.

FIG. 1 is a flowchart representing a method of manufacturing a flexible display apparatus according to an embodiment of the inventive concept, FIGS. 2A, 3A, 4A, and 5A are plan views illustrating a process of manufacturing the flexible display apparatus according to an embodiment of the inventive concept, and FIGS. 2B, 3B, 4B, 5B, 6, and 7 are cross-sectional views illustrating a process of manufacturing the flexible display apparatus according to an embodiment of the inventive concept. FIGS. 2B, 3B, 4B, and 5B are cross-sectional views taken along line I-I' of FIGS. 2A, 3A, 4A, and 5A, respectively.

Referring to FIG. 1, first, silicon powder is prepared in operation S10.

Figure 2B:
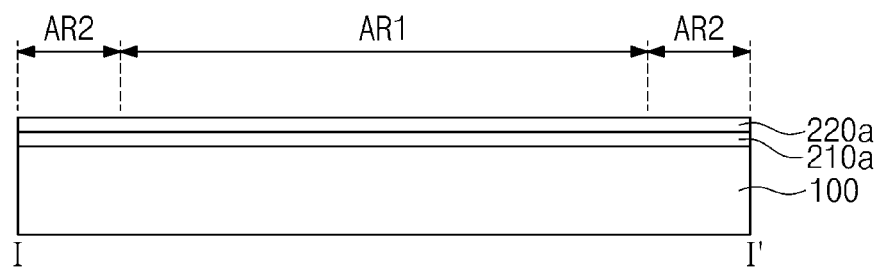
FIGS. 2B, 3B, 4B, 5B, 6, and 7 are cross-sectional views illustrating the manufacturing process of forming a flexible display apparatus according to an embodiment of the inventive concept.

A substrate 100 of FIG. 2B may be a glass substrate, a polymer film, or a silicon wafer that support a flexible substrate 300 (refer to FIGS. 4A and 4B) in order to form a flexible display apparatus. However, the embodiment of the inventive concept is not limited thereto. For example, the substrate 100 may be made of any material having a charge.

Thereafter, a process of treating a surface of the substrate 100 so that the surface of the substrate 100 (refer to FIGS. 2A and 2B) has a second charge that is opposite to a first charge may be added. Here, the substrate 100 may be plasma-treated to have the second charge. In an embodiment of the inventive concept, the second charge may be a negative charge.

Referring to FIGS. 1, 2A, and 2B, a first charge adhesive layer having the first charge is formed on the substrate 100 in operation S10.

A solution containing a graphene oxide having the first charge may be applied on the substrate 100. Besides dip coating, a coating method may be one selected from the group consisting of spray coating, spin coating, screen coating, offset printing, inkjet printing, pad printing, knife coating, kiss coating, gravure coating, brushing, ultrasonic micro-spraying coating, and spray-mist spraying coating. However, the embodiment of the inventive concept is not limited thereto and any coating method may be used as needed.

Thereafter, the first charge adhesive layer 210a having the first charge may be formed by performing a process of removing foreign substances in the graphene oxide solution applied on the substrate 100 and a process of drying. In an embodiment of the inventive concept, the first charge may be a positive charge.

Thereafter, a second charge adhesive layer 220a having the second charge is formed on the first charge adhesive layer 210a in operation S20.

The second charge adhesive layer 220a may include one of transparent montmorillonite, molybdenum disulfide (MoS2), and hexagonal boron nitride (hBN). A solution containing montmorillonite, molybdenum disulfide (MoS2), or hexagonal boron nitride (hBN) having the second charge may be applied on the first charge adhesive layer 210a. Besides dip coating, a coating method may be one selected from the group consisting of spray coating, spin coating, screen coating, offset printing, inkjet printing, pad printing, knife coating, kiss coating, gravure coating, brushing, ultrasonic micro-spraying coating, and spray-mist spraying coating. However, the embodiment of the inventive concept is not limited thereto and any other coating method may be included.

Thereafter, the second charge adhesive layer 220a having the second charge may be formed by performing a process of removing foreign substances in the solution containing montmorillonite, molybdenum disulfide (MoS2), or hexagonal boron nitride (hBN) and a process of drying. In an embodiment of the inventive concept, the second charge may be a negative charge.

Each of the montmorillonite and the molybdenum disulfide may be substantially a transparent material. Accordingly, as described later, although the solution may partially remain on a rear surface of a flexible substrate while manufacturing the transparent flexible display, high transmittance may be secured.

In an embodiment of the inventive concept described with reference to FIGS. 2A and 2B, although a pair of the first charge adhesive layer 210a and the second charge adhesive layer 220a is exemplarily described, the process described with reference to FIGS. 2A and 2B may be repeated to form two or more pairs thereof.

Figure 3A:
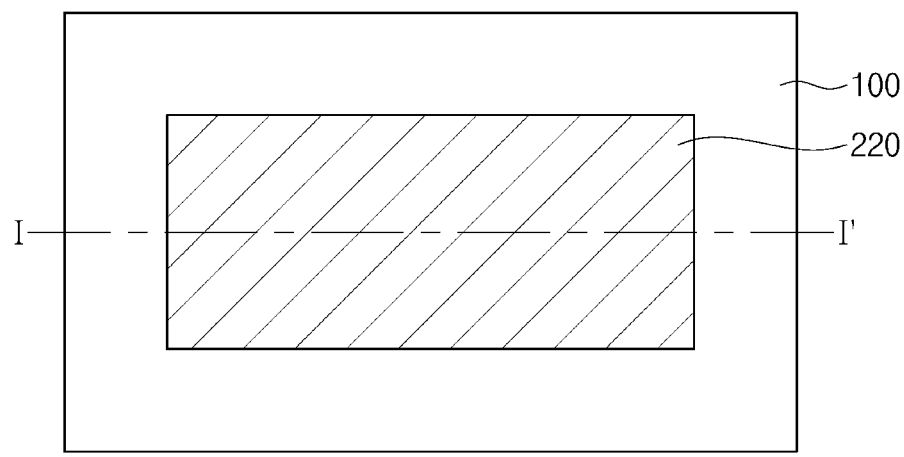
Figure 3B:
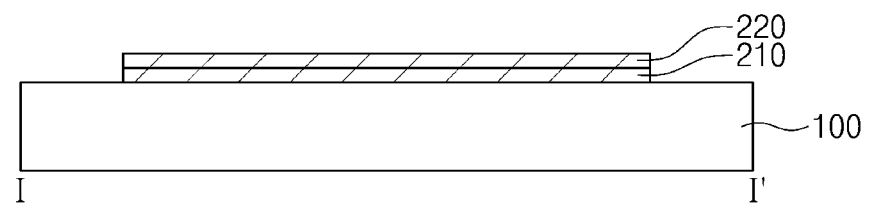

Thereafter, referring to FIGS. 1, 3A, and 3B, a first charge adhesive pattern 210 and a second charge adhesive pattern 220 are formed by removing a portion of an edge of each of the first charge adhesive layer 210a and the second charge adhesive layer 220a in operation S30.

A first area AR1 and a second area AR2 may be defined on the laminated first and second charge adhesive layers 210a and 220a on a plane. The first area AR1 may have a rectangular shape. The second area AR2 may surround the first area AR1 as an edge area of the first area AR1. However, the embodiment of the inventive concept is not limited thereto. For example, the second area AR2 may surround three sides of the first area AR1 instead of completely surrounding the first area AR1.

Thereafter, a portion of each of the first charge adhesive layer 210a and the second charge adhesive layer 220a, which corresponds to the second area AR2, may be removed by spraying a gas in a plasma state, in which nitrogen and air are mixed.

The operation S30 is performed, and then a portion of a top surface of the substrate 100 may be exposed.

Figure 4A:
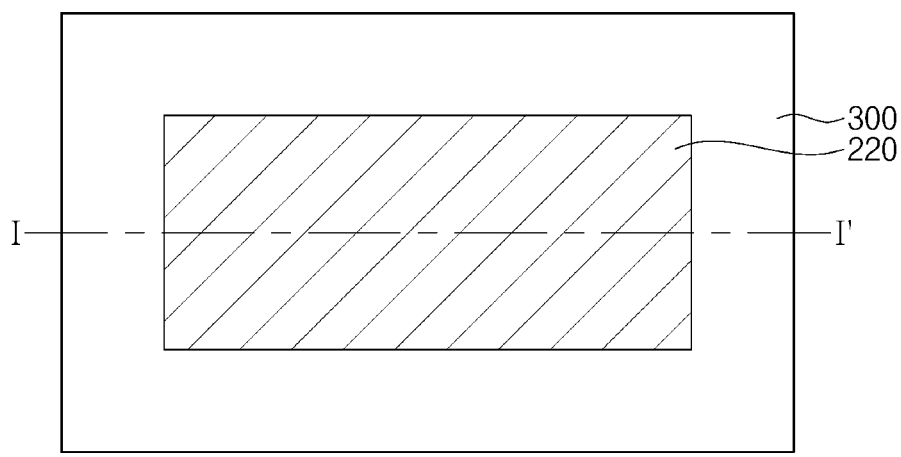
Figure 4B:
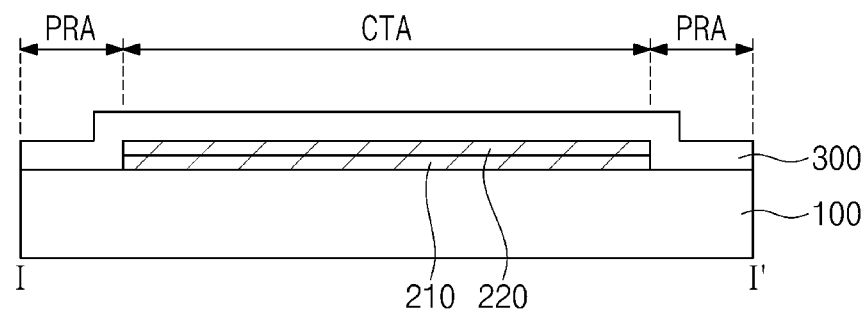

Referring to FIGS. 1, 4A, and 4B, thereafter, a flexible substrate 300 is formed on the substrate 100 on which the second charge pattern 220 is formed in operation S40.

The flexible substrate 300 is a substantially transparent or transflective plastic substrate having flexibility. The flexible substrate 300 may be made of the material selected from the group consisting of polyester, polyvinyl, polycarbonate, polyethylene, polyacetate, polyimide, polyethersulphone (PES), polyacrylate (PAR), polyethylenenaphthalate (PEN), and polyethyleneterephehalate (PET).

The flexible substrate 300 may be formed by applying and curing a polymer material on the first charge adhesive pattern 210 and the second charge adhesive pattern 220. Here, the polymer material may be applied on an area greater than that occupied by the first charge adhesive pattern 210 and the second charge adhesive pattern 220. The applied polymer material may entirely cover the first charge adhesive pattern 210 and the second charge adhesive pattern 220. Besides dip coating, a coating method may be one selected from the group consisting of spray coating, spin coating, screen coating, offset printing, inkjet printing, pad printing, knife coating, kiss coating, gravure coating, brushing, ultrasonic micro-spraying coating, and spray-mist spraying coating. However, the embodiment of the inventive concept is not limited thereto. For example, the coating method may include another coating method.

Through the operation S40, the flexible substrate 300 may contact a portion of the top surface of the substrate, which is exposed in the operation S30.

Figure 5A:
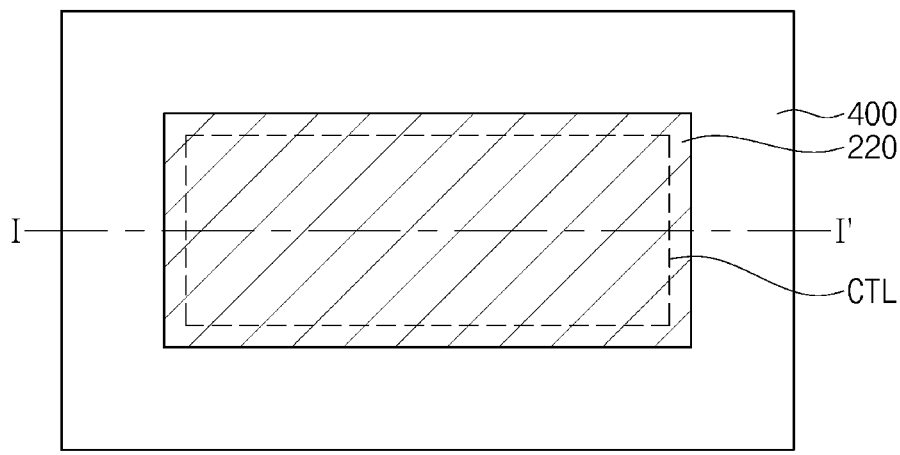
Figure 5B:
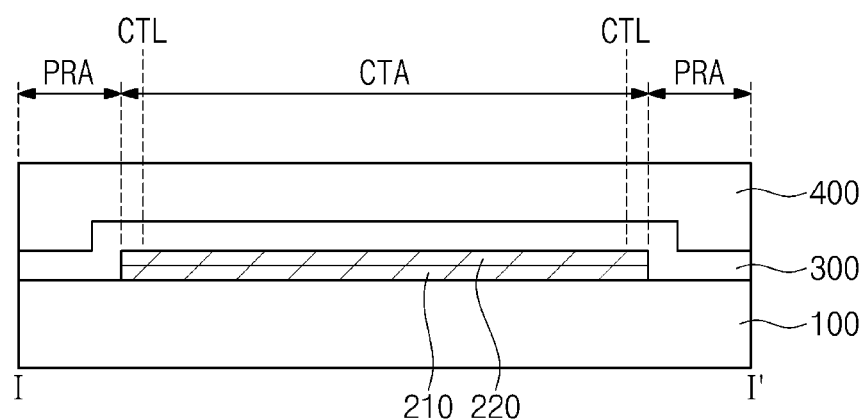

Thereafter, referring to FIGS. 1, 5A, and 5B, a display unit 400 is formed on the flexible substrate 300 in operation S50.

The display unit 400 may be formed by sequentially forming a circuit element layer, a display element layer, and an encapsulation layer. A structure of the display unit 400 will be described later, and description on a detailed method of forming the display unit 400 will be omitted.

Referring to FIGS. 4A, 4B, 5A, and 5B, a central area CTA and a peripheral area RPA may be defined on the flexible substrate 300. The central area CTA overlaps the first charge adhesive pattern 210 and the second charge adhesive pattern 220, and the peripheral area PRA does not overlap the first charge adhesive pattern 210 and the second charge adhesive pattern 220.

The first charge adhesive pattern 210 and the second charge adhesive pattern 220, which have polarities opposite to each other, between the substrate 100 and the flexible substrate 300 on the central area CTA. The Van der Waals force, which is a kind of molecular force, acts between the first charge adhesive pattern 210 and the second charge adhesive pattern 220. Accordingly, an adhesion force between the substrate 100 and the flexible substrate 300 on the central area CTA is relatively low.

The substrate 100 and the flexible substrate 300 directly contact each other on the peripheral area PRA. The adhesion force between the substrate 100 and the flexible substrate 300 on the peripheral area PRA is relatively greater than that between the substrate 100 and the flexible substrate 300 on the central area CTA. The adhesion force between the substrate 100 and the flexible substrate 300 may increase at the peripheral area PRA in which the substrate 100 and the flexible substrate 300 directly contact each other through a process of forming the display unit 400 on the flexible substrate 300, particularly, a process of forming a barrier layer on the flexible substrate 300 for preventing moisture or oxygen from entering.

In forming the display unit 400, a module on which the substrate 100, the first charge adhesive pattern 210, the second charge adhesive pattern 220, and the flexible substrate 300 are formed may be moved or turned-over. In peripheral are PRA, the flexible substrate 300 directly laid on the substrate 100 with stronger adhesion than center area CTA that has different charge areas therebetween. Without the peripheral area PRA where the flexible substrate 300 directly contacts the substrate 100, the substrate 100 and the flexible substrate 300 may be easily separated, and subsequent processes may not be performed, because the substrate 100 and the flexible substrate 300 in the center area CTA have a low adhesion force due to the first charge adhesive pattern 210 and the second charge adhesive pattern 220.

In the method of manufacturing the flexible display apparatus according to an embodiment of the inventive concept, since the substrate 100 and the flexible substrate 300 directly contact each other in the peripheral area PRA to have a relatively great adhesion force therebetween, the substrate 100 and the flexible substrate 300 may not be easily separated in the process of forming the display unit 400.

The first charge adhesive pattern 210 and the second charge adhesive pattern 220 disposed between the substrate 100 and the flexible substrate 300 have a relatively weak adhesion force than that of an area in which the substrate 100 and the flexible substrate 300 directly contact each other. However, the first charge adhesive pattern 210 and the second charge adhesive pattern 220 are necessary to have an adhesion force not less than a reference value. When the first charge adhesive pattern 210 and the second charge adhesive pattern 220 have an adhesion force less than the reference value, and the module on which the substrate 100, the first charge adhesive pattern 210, the second charge adhesive pattern 220, and the flexible substrate 300 are formed is turned over, although the substrate 100 and the flexible substrate 300 are attached to each other in the peripheral area PRA, as the substrate 100 and the flexible substrate 300 are separated from each other in the central area CTA, the flexible substrate 300 may be deflected due to an own weight.

Thus, the first charge adhesive pattern 210 and the second charge adhesive pattern 220 may have an adhesion force of a range of about 1 gf/in to about 10 gf/in.

Figure 8:
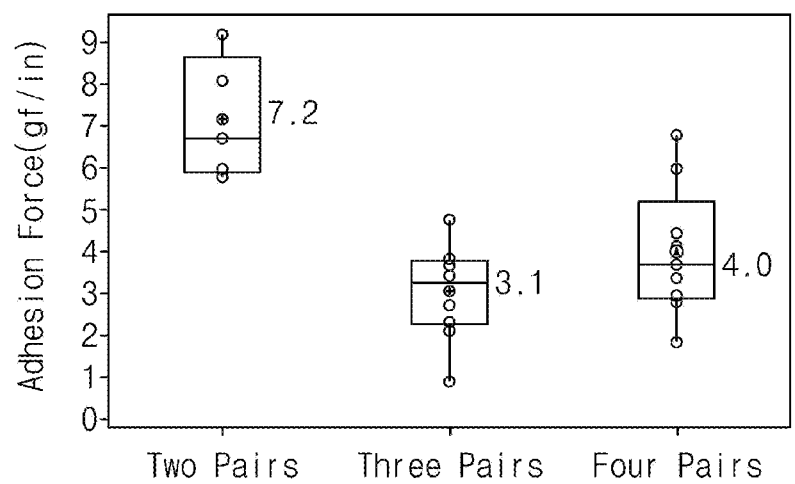
FIG. 8 is a graph showing a test result of adhesion forces of a first charge adhesive pattern and a second charge adhesive pattern.

FIG. 8 is a graph showing a test result of adhesion forces of the first charge adhesive pattern 210 and the second charge adhesive pattern 220. In FIG. 8, adhesion forces when two to four pairs of first charge adhesive pattern 210 and the second charge adhesive pattern 220 are provided.

When the two to four pairs of first charge adhesive pattern 210 and the second charge adhesive pattern 220 are provided, the adhesion force therebetween satisfies the range of about 1 gf/in to about 10 gf/in, particularly a range of 3 gf/in to about 8 gf/in.

Referring to FIGS. 5A to 5B, the substrate 100, the first charge adhesive pattern 210, the second charge adhesive pattern 220, the flexible substrate 300, and the display unit 400 are cut along a cutting line CTL in operation S60.

The cutting line CTL may overlap the first charge adhesive pattern 210 and the second charge adhesive pattern 220 on a plane. The cutting line CTL may have a closed loop shape on the plane and be defined along an edge of each of the first charge adhesive pattern 210 and the second charge adhesive pattern 220.

Accordingly, the peripheral area PRA of the flexible substrate PRA is removed, and only the central area CTA remains. That is, the substrate 100 and the flexible substrate 300 are attached to each other by only the first charge adhesive pattern 210 and the second charge adhesive pattern 220.

Figure 6:
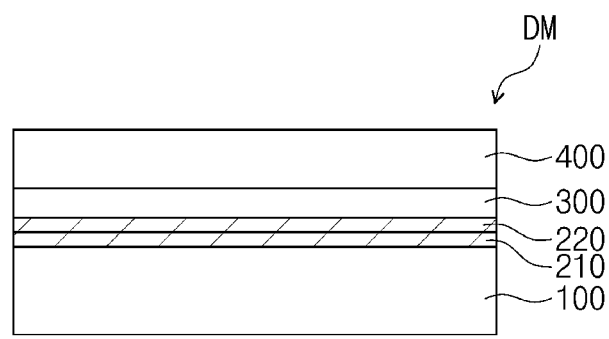

Referring to FIG. 6, as the substrate 100, the first charge adhesive pattern 210, the second charge adhesive pattern 220, the flexible substrate 300, and the display unit 400 are cut, a display module DM is generated.

Figure 7:
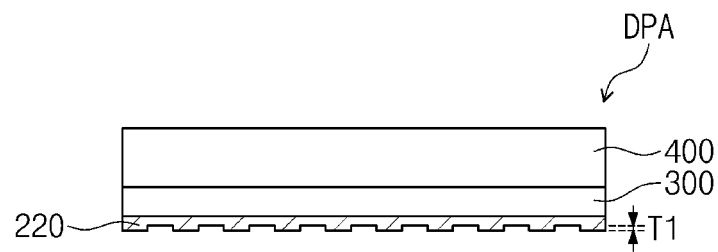

Thereafter, referring to FIGS. 1 and 7, the substrate 100 and the flexible substrate 300 are separated from the display module DM in operation S70.

The substrate 100 and the flexible substrate 300 may be separated by using a vacuum suction device. The substrate 100 and the flexible substrate 300 may be separated by fixing the display unit 400 on a vacuum suction state, and then suctioning the substrate 100 to apply a force to the substrate 100 in an upward direction. However, the embodiment of the inventive concept is not limited thereto. For example, the substrate 100 and the flexible substrate 300 may be separated through various other methods.

As a result of separating the substrate 100 and the flexible substrate 300, a flexible display module DPA is generated.

The second charge adhesive pattern 220 may remain at the bottom of the separated flexible substrate 300, and the first charge adhesive pattern 210 may remain at a top surface of the substrate 100.

Since the second charge adhesive pattern 220 is substantially transparent, the second charge adhesive pattern 220 may not substantially affect a light transmittance of the flexible display module DPA.

Thereafter, the flexible display module DPA is cut to form a plurality of display panels DP. Thereafter, a transparent flexible display apparatus may be manufactured by using the display panel DP.

Figure 9:
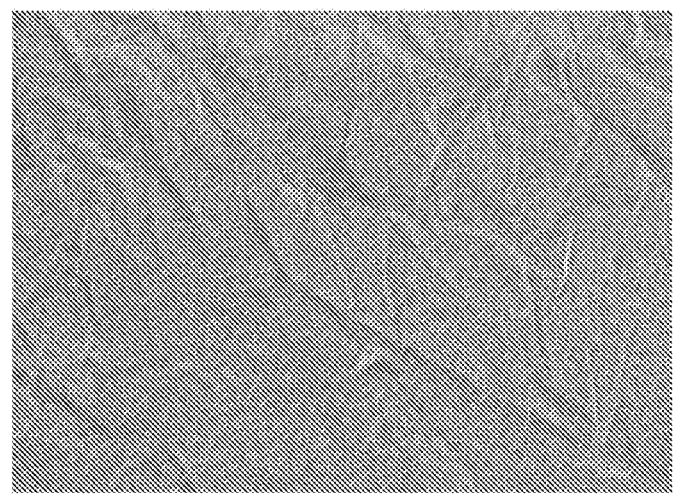
FIG. 9 is a photograph showing a bottom surface of a transparent flexible display module according to an embodiment of the inventive concept in FIG. 7.

FIG. 9 is a photograph showing a bottom surface of the transparent flexible display module DPA according to an embodiment of the inventive concept in FIG. 7.

Referring to FIGS. 7 and 9, when the second charge adhesive pattern 220 and the first charge adhesive pattern 210 are separated, a portion of a surface of the second charge adhesive pattern 220 may be also removed. Accordingly, the bottom surface of the second charge adhesive pattern 220 may have concave-convex shape. The concave-convex shape of the second charge adhesive pattern 220 may be randomly distributed on the plane. Also, the concave-convex of the second charge adhesive pattern 220 may have a height T1 of about 1 nm or less.

Through the method of manufacturing the flexible display apparatus according to an embodiment of the inventive concept, since the adhesion force between the substrate 100 and the flexible substrate 300 have a relatively lower than that between the first charge adhesive pattern 210 and the second charge adhesive pattern 220, the substrate 100 and the flexible substrate 300 may be easily separated without performing an additional process.

When a process of weakening the adhesion force between the substrate 100 and the flexible substrate 300 by irradiating laser from therebelow is additionally performed, besides the additional process, the bottom surface of the flexible substrate 300 is burned or becomes to have a yellow color (yellowing, yellow index increase) due to the laser irradiation. Thus, the additional process is not suitable for the transparent flexible display apparatus.

The method of manufacturing the flexible display apparatus according to an embodiment of the inventive concept may prevent the bottom surface of the flexible substrate 300 from burning, and being yellow by easily separating the substrate 100 and the flexible substrate 300 without laser radiation, and thus enabling to manufacture the transparent flexible display apparatus with a higher transmittance.

Figure 10A:
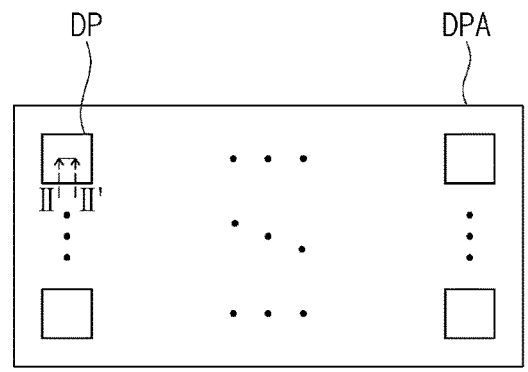
FIG. 10A is a plan view illustrating a transparent flexible display module DPA in FIG. 7.
Figure 10B:
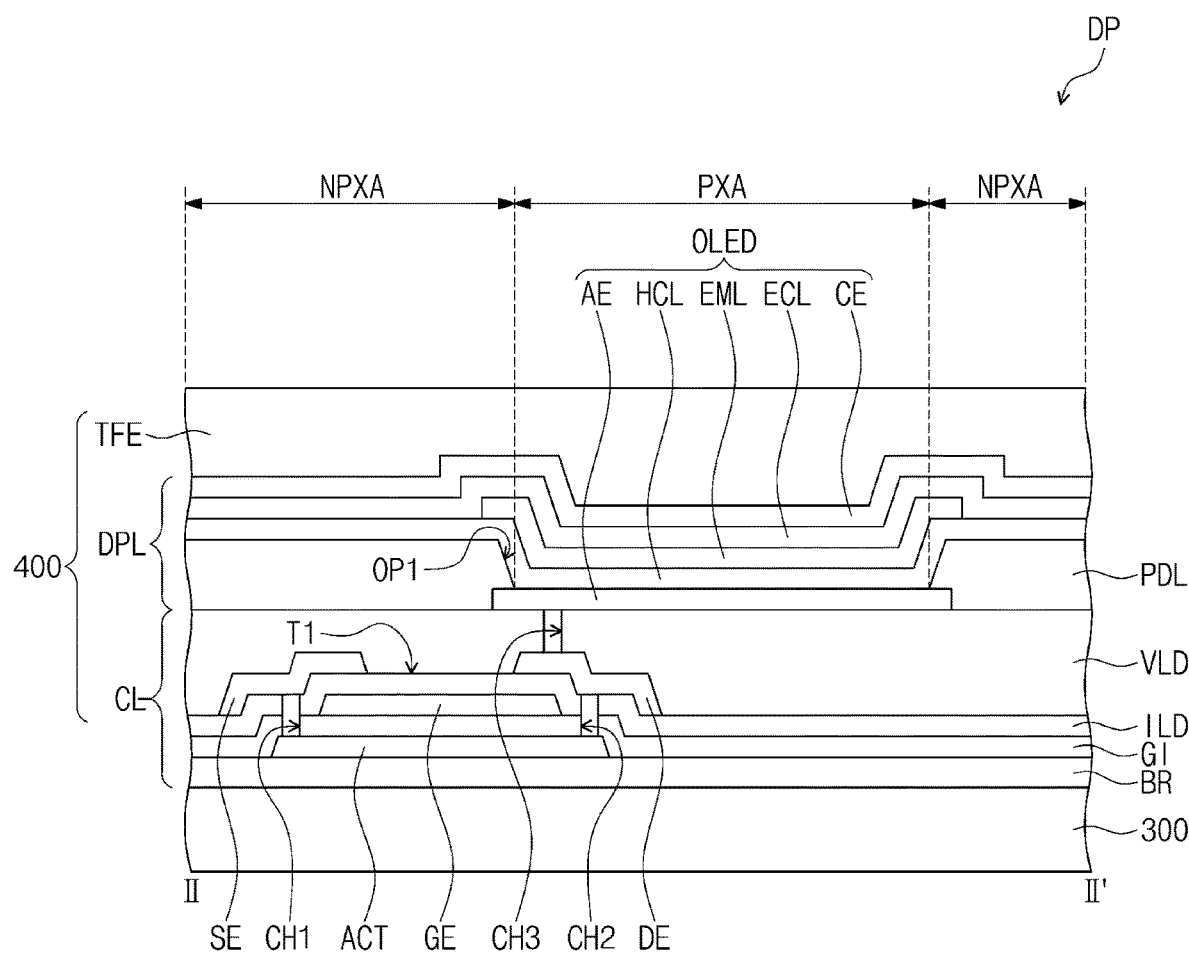
FIG. 10B is a cross-sectional view taken along line II-II' of FIG. 10A.

FIG. 10A is a plan view illustrating the transparent flexible display module DPA in FIG. 7, and FIG. 10B is a cross-sectional view taken along line II-II' of FIG. 10A. FIG. 10B is a cross-sectional view illustrating a portion of the display panel DP, particularly, a portion corresponding to one pixel.

Referring to FIGS. 10A and 10B, the transparent flexible display module DPA may include a plurality of display panels DP. The display panels DP may be spaced apart from each other. The display panels DP may be individually cut and adopted to the display apparatus.

Referring to FIG. 10B, the display unit 400 may include a circuit element layer CL, a display element layer DPL, and an encapsulation layer TFE. Although not shown, the display unit 400 may further include at least one of a touch sensor, a reflection preventing layer, and a window member.

The circuit element layer CL may include signal lines, a scan line GL, a data line DL, and a power line PL. Also, the circuit element layer CL may include a plurality of transistors and a capacitor. In FIG. 10B, a first transistor T1 is exemplarily described.

The circuit element layer CL may include a barrier layer BR, an active layer ACT, a gate insulation layer GI, a gate electrode GE, an interlayer insulation layer ILD, input and output electrodes SE and DE, and an intermediate insulation layer VLD.

The barrier layer BR is disposed on the flexible substrate 300 and prevents foreign substances from being introduced beyond the barrier layer BR.

Although not shown, the display unit 400 may further include a buffer layer (not shown) disposed on the barrier layer BR. The buffer layer (not shown) improves a coupling force between the flexible substrate 300 and layers disposed thereon. The buffer layer BR and the barrier layer (not shown) may be selectively provided or omitted.

The active layer ACT is disposed on the barrier layer BR. The active layer ACT may serve as a channel region of the first transistor T1. The active layer ACT may be selected from amorphous silicon, polysilicon, and a metal oxide semiconductor.

The gate insulation layer GI may be disposed on the active layer ACT. The gate insulation layer GI may insulate the gate electrode GE from the active layer ACT.

The gate electrode GE may be disposed on the gate insulation layer GI. The gate electrode GE may overlap the active layer ACT.

A first conductive layer (not shown) providing signal lines may be disposed on the same layer as the gate electrode GE.

The interlayer insulation layer ILD is disposed on the gate electrode GE. The interlayer insulation layer ILD electrically insulates the gate electrode GE from the input and output electrodes SE and DE. The interlayer insulation layer ILD may contain an inorganic material. The inorganic material may include silicon nitride, silicon oxynitride, silicon oxide, and the like.

The input and output electrodes SE and DE are disposed on the interlayer insulation layer ILD. The input and output electrodes SE and DE may be electrically connected to the active layer ACT through first and second contact holes CH1 and CH2 defined in the interlayer insulation layer ILD and the gate insulation layer GI, respectively.

A second conductive layer (not shown) providing signal lines may be disposed on the same layer as the input and output electrodes SE and DE.

Although the display panel DP has a top-gate structure in which the gate electrode GE is disposed on the active layer ACT in an embodiment of the inventive concept, the display panel DP may have a bottom-gate structure in which the gate electrode GE is disposed below the active layer ACT in another embodiment.

The intermediate insulation layer VLD is disposed on the input and output electrodes SE and DE. The intermediate insulation layer VLD may provide a planarized surface. The intermediate insulation layer VLD may include an organic material. The organic material may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

The display element layer DPL is disposed on the intermediate insulation layer VLD. The display element layer DPL may include a pixel defining layer PDL and a display element. In an embodiment of the inventive concept, the display element may be an organic light emitting diode OLED. The organic light emitting diode OLED includes a first electrode AE, a hole control layer HCL, a light emitting layer EML, an electron control layer ECL, and a second electrode CE.

The pixel defining layer PDL may contain an organic material. The first electrode AE is disposed on the intermediate insulation layer VLD. The first electrode AE is connected to the output electrode DE through a third contact hole CH3 passing through the intermediate insulation layer VLD. A first opening OP1 is defined in the pixel defining layer PDL. The first opening OP1 of the pixel defining layer PDL exposes at least a portion of the first electrode AE.

A light emitting area PXA and a non-light emitting area NPXA disposed adjacent to the light emitting area PXA may be defined on the transparent flexible display panel DP. The non-light emitting area NPXA may surround the light emitting area PXA. In the embodiment, the light emitting area PXA may be defined in correspondence to a portion of the first electrode AE, which is exposed by the first opening OP1.

A hole control layer HCL may be disposed in common on the light emitting area PXA and the non-light emitting area NPXA. Although not separately shown, a common layer such as the hole control layer HCL may be disposed in common on a plurality of organic light emitting diodes OLED.

The light emitting layer EML is disposed on the hole control layer HCL. The light emitting layer EML may be disposed on an area corresponding to the first opening OP1. That is, the light emitting layer EML may be divided and provided on each of the plurality of organic light emitting diodes OLED. The light emitting layer EML may contain an organic material and/or an inorganic material. Although the patterned light emitting layer EML is exemplarily illustrated in the embodiment, the light emitting layer EML may be disposed in common on the plurality of organic light emitting diodes OLED. Here, the light emitting layer EML may generate white light. Also, the light emitting layer EML may have a multilayer structure.

The electron control layer ECL is disposed on the light emitting layer EML. Although not separately shown, the electron control layer ECL may be disposed in common on the plurality of organic light emitting diodes OLED.

The second electrode CE is disposed on the electronic control layer ECL. The second electrode CE is disposed in common on the plurality of organic light emitting diodes OLED.

The encapsulation layer TFE seals the display element layer DPL. The encapsulation layer TFE is disposed on the second electrode CE. The encapsulation layer TFE is disposed in common on the plurality of organic light emitting diodes OLED. In the embodiment, the encapsulation layer TFE directly covers the second electrode CE. In another embodiment of the inventive concept, a capping layer covering the second electrode CE may be further disposed between the encapsulation layer TFE and the second electrode CE. Here, the encapsulation layer TFE may directly cover the capping layer.

The encapsulation layer TFE includes at least one inorganic layer (hereinafter, referred to as an encapsulation inorganic layer). The encapsulation layer TFE may further include at least one organic layer (hereinafter, referred to as an encapsulation organic layer). The encapsulation inorganic layer protects the display element layer DPL against moisture/oxygen, and the encapsulation organic layer protects the display element layer DPL against foreign substances such as dust particles. The encapsulation inorganic layer may include a silicon nitride layer, a silicon oxynitride layer, a silicon oxide layer, a titanium oxide layer, or an aluminum oxide layer. The encapsulation organic layer may include an acrylic-based organic layer. However, the embodiment of the inventive concept is not limited thereto.

Figure 11:
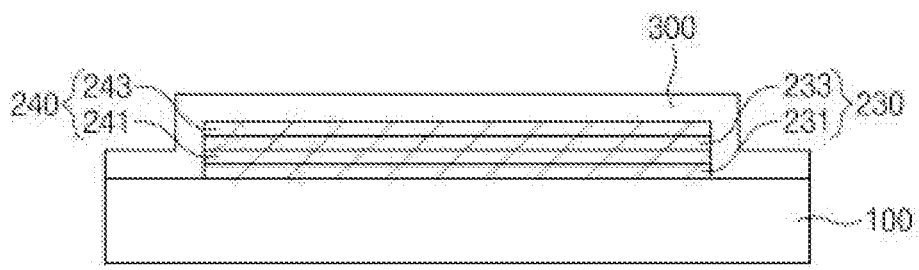
FIGS. 11, 12, and 13 are cross-sectional views illustrating a manufacturing process for forming a flexible display apparatus according to another embodiment of the inventive concept.
Figure 12:
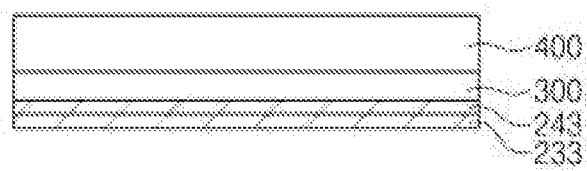

FIGS. 11 and 12 are cross-sectional views illustrating a manufacturing process for forming a flexible display apparatus according to another embodiment of the inventive concept.

FIG. 11 is a cross-sectional view illustrating processes corresponding to FIG. 4B and the operation S40 in FIG. 1 in another embodiment of the inventive concept.

Referring to FIG. 11, the processes corresponding to the operations S10 to S40 in FIG. 1 will be described, and processes, which are not described, will be followed by descriptions related to FIGS. 1 to 4B.

Referring to FIG. 11, the first charge adhesive pattern 230 and the second charge adhesive pattern 240 are formed on the substrate 100. The first charge adhesive pattern 230 has a first charge, and the second charge adhesive pattern 240 has a second charge.

The first charge adhesive pattern 230 has a lower first charge adhesive pattern 231 and an upper first charge adhesive pattern 233. The second charge adhesive pattern 240 has a lower second charge adhesive pattern 241 and an upper second charge adhesive pattern 243.

The lower first charge adhesive pattern 231, the lower second charge adhesive pattern 241, the upper first charge adhesive pattern 233, and the upper second charge adhesive pattern 243 may be sequentially laminated on the substrate 100. The lower first charge adhesive pattern 231, the lower second charge adhesive pattern 241, the upper first charge adhesive pattern 233, and the upper second charge adhesive pattern 243 may be formed such that coating, cleaning, and drying processes of each of the lower first charge adhesive layer, the lower second charge adhesive layer, the upper first charge adhesive layer, and the upper second charge adhesive layer are performed on the substrate 100, and then an edge of each of the four layers is removed.

Although the first charge adhesive pattern 230 and the second charge adhesive pattern 240 each having two layers are exemplarily illustrated in FIG. 11, each of the first charge adhesive pattern 230 and the second charge adhesive pattern 240 may have three or more layers.

In an embodiment of the inventive concept, the lower first charge adhesive pattern 231 may include graphene oxide, the lower second charge adhesive pattern 241 may include montmorillonite, molybdenum disulfide, or hexagonal boron nitride (hBN), the upper first charge adhesive pattern 233 may include polyethyleneimine (PEI), and the upper second charge adhesive pattern 243 may include montmorillonite, molybdenum disulfide, or hexagonal boron nitride (hBN).

Figure 13:
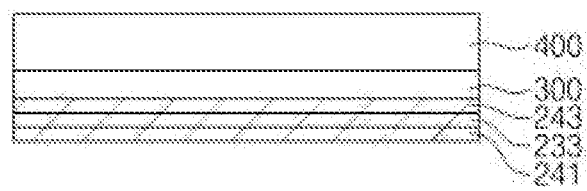

FIGS. 12 and 13 are cross-sectional views illustrating a state, in which processes corresponding to the operations S50 to S70 in FIG. 1 are performed, in the embodiment of the inventive concept.

When a process corresponding to the operation S70 in FIG. 1 is performed, the substrate 100 and the flexible substrate 300 may be separated so that at least the lower first charge adhesive pattern 231 remained on the substrate 100, and at least one of the lower second charge adhesive pattern 241, the upper first charge adhesive pattern 233, and the upper second charge adhesive pattern 243 remained on the flexible substrate 300. In FIG. 12, a state in which, the upper first charge adhesive pattern 233 and the upper second charge adhesive pattern 243 remained on the flexible substrate 300, is exemplarily illustrated. However, the embodiment of the inventive concept is not limited thereto. For example, the upper first charge adhesive pattern 233, the upper second charge adhesive pattern 243, and the lower second charge pattern 241 may remain on the flexible substrate 300 as seen in FIG. 13.

The polyethyleneimine (PEI) has a transmittance greater than that of the graphene oxide.

In the embodiment of the inventive concept described with reference to FIGS. 11 and 12, one layer of the plurality of first charge adhesive pattern 230, which is disposed adjacent to the flexible substrate 300, contains polyethyleneimine (PEI), and the other layer thereof, which is disposed adjacent to the substrate 100, includes graphene oxide. Thereafter, when the substrate 100 and the flexible substrate 300 are separated, a layer containing the polyethyleneimine (PEI) of the plurality of first charge adhesive patterns 230 remains on the flexible substrate 300, and a layer containing the graphene oxide is removed together with the substrate 100. Accordingly, when the plurality of first and second charge adhesive patterns 230 and 240 are used, as the graphene oxide is used, adhesive reliability may improve during the manufacturing process, and, at the same time, manufacturing the transparent flexible display apparatus having a higher transmittance.

The method of manufacturing the flexible display apparatus according to the embodiment of the inventive concept, may prevent the bottom surface of the flexible substrate from burning, and from becoming yellow by easily separating the substrate and the flexible substrate without laser irradiation, and thus manufacturing the transparent flexible display apparatus having a higher transmittance.

Through the method of manufacturing the flexible display apparatus according to the embodiment of the inventive concept, since the substrate and the flexible substrate directly contact each other in the peripheral area to have a high adhesion force, the substrate and the flexible substrate may not be easily separated in the process of forming the display unit.

Although the exemplary embodiments of the present invention have been described, it is understood that the present invention should not be limited to these exemplary embodiments but various changes and modifications can be made by one of ordinary skill in the art within the spirit and scope of the present invention as hereinafter claimed.

Hence, the real protective scope of the inventive concept shall be determined by the technical scope of the accompanying claims.

What is claimed is:
1. A flexible display apparatus, comprising:
a flexible substrate;
a circuit element layer disposed on the flexible substrate;
a display element layer disposed on the circuit element layer and comprising an organic light emitting diode;
an encapsulation layer disposed on the display element layer to seal the display element layer;
a charge adhesive layer that contacts a lower surface of the flexible substrate; and
a lower charge adhesive layer that contacts a lower surface of the charge adhesive layer,
wherein the charge adhesive layer has a charge, and comprises a transparent montmorillonite,
wherein the lower charge adhesive layer comprises polyethyleneimine (PEI), and
wherein the flexible display apparatus is flexible.

2. The flexible display apparatus of claim 1,
wherein the charge of the adhesive layer is a first charge, and
wherein the lower charge adhesive layer has a second charge opposite the first charge.

\* \* \* \* \*